United States Patent [19]

Wieland

[11] Patent Number: 5,121,059
[45] Date of Patent: Jun. 9, 1992

[54] MAGNETIC RESONANCE SPECTROSCOPIE IMAGING METHOD

[75] Inventor: Jürgen Wieland, Pinneberg, Fed. Rep. of Germany

[73] Assignee: U.S. Philips Corporation, New York, N.Y.

[21] Appl. No.: 539,408

[22] Filed: Jun. 13, 1990

[30] Foreign Application Priority Data

Jun. 22, 1989 [DE] Fed. Rep. of Germany ....... 3920433

[51] Int. Cl.⁵ .......................................... G01R 33/20
[52] U.S. Cl. .................................. 324/309; 324/307
[58] Field of Search ............... 324/307, 309, 310, 311, 324/312, 314; 128/653 A

[56] References Cited

U.S. PATENT DOCUMENTS 4,748,409 5/1988 Frahm et al. ..................... 324/309
4,924,183 5/1990 Kunz et al. ....................... 324/309
4,962,357 10/1990 Sotak ................................ 324/311

Primary Examiner—Hezron E. Williams
Assistant Examiner—Louis M. Arana
Attorney, Agent, or Firm—William Squire

[57] ABSTRACT

A method of reproducing the lactate distribution in a slice comprises first and second sequences, each comprising generating at least three rf pulses. The first sequence is such that the resultant stimulated echo signal remains uninfluenced by the lactate components, the second sequence is such that the stimulated echo signal is determined by the lactate component. A group of difference signals is formed by subtracting the two stimulated echo signals and repeating of these sequences with encoding gradients which vary as regards strength and/or direction, the group is suitable for determining the desired distribution by two-dimensional Fourier transformation.

7 Claims, 3 Drawing Sheets

MAGNETIC RESONANCE SPECTROSCOPIE IMAGING METHOD

BACKGROUND OF THE INVENTION

Of interest is commonly owned copending applications entitled "CARBON MR SPECTROSCOPY METHOD AND DEVICE FOR PERFORMING THE METHOD", Ser. No. 507,941 filed Apr. 10, 1990 in the name of Bamsdorf et al. and "Nuclear Spin Examination Process and Arrangement for Carrying out the Process", Ser. No. 489,408 filed Mar. 3, 1990 in the name of J. K. H. Dietrich.

The invention relates to a magnetic resonance imaging method. DE-OS 34 45 689 corresponding to U.S. Pat. No. 4,748,409 discloses a method of this kind in which a plurality of sequences act on an examination zone in the presence of a uniform, steady magnetic field. Each sequence comprises three rf pulses, one of which is slice-selective. The amplitude of a magnetic gradient field (the so-called phase encoding gradient) is then varied from one sequence to another. The stimulated echo signals thus obtained are suitable for reconstructing, using a two-dimensional Fourier transformation, the nuclear magnetization distribution in the slice excited by the slice-selective rf pulse. The image thus obtained is determined essentially by the hydrogen-bound protons. The protons bound to fat (lipids) or lactate also have an effect on the image, but this effect is extremely small because of the low concentration of these components.

It has recently been found that lactate is an important metabolite of tumors, so that it can be used to identify such tumors. It is the object of the present invention to provide a method enabling determination of the spatial distribution of lactate.

SUMMARY OF THE INVENTION

This object is achieved by a method which comprises the following steps:

a) generating a first sequence comprising three rf pulses at least one of which is slice-selective, between the first and the second rf pulse as well as after the third rf pulse and prior to the detection of the spin resonance signal there being applied a magnetic gradient field with each time the same time integral, the distance in time between the first and the second rf pulse amounting to $\frac{1}{2}$ J, where J is the coupling lactate, b) generating a second sequence which deviates from the first sequence in that additionally two 180° rf pulses are generated each time at the same distance from the first and the third rf pulse, respectively, one 180° rf pulse being situated halfway between the first and the second rf pulse, both 180° rf pulses being frequency-selective so that only one of the two coupled lactate components is excited, c) detecting the stimulated echo signals occurring in each sequence, d) repeating the steps a) to c), while varying at least one magnetic gradient field in respect of strength and-/or direction, e) forming the difference between the stimulated echo signals of the first and the second sequences, f) reconstructing the lactate distribution in the excited slice from the differences.

The invention utilizes the fact that the resonance lines of the coupled lipid components are situated comparatively near one another and near one of the two coupled lactate components; the other lactate component is situated in the vicinity of the resonance line of water. The lipid components (coupled and uncoupled) excited by the rf pulses contribute to the stimulated echo signal thus generated in each sequence, so that the effect of these components is eliminated when the difference is formed between the stimulated signals of the first and the second sequence.

When the polarization transfer from the lactate component whose frequency neighbors that of water to the other lactate component is prevented (for example in that the former component is suppressed in advance, together with the water component, or in that two of the three rf pulses are frequency-selective, thus exciting only the other lactate component), the excitation energy for the other component disappears (because of polarization transfer and the appearance of higher quantum states which cannot be observed) during the first sequence, so that this lactate component does not influence the stimulated echo signal then occurring. However, during the second sequence the 180° pulse which is situated exactly halfway between the first and the second rf pulse and the 180° rf pulse succeeding the last one of the three rf pulses refocus the modulation of this lactate component, caused by the J coupling, so that in the second sequence the lactate component makes a contribution to the stimulated echo signal. When the difference between the stimulated echo signals of the first and the second sequence is formed, a signal is obtained which is determined essentially only by this lactate component.

A device for performing the method comprises a magnet for generating a uniform, steady magnetic field, means for the repeated generation of the first and the second sequence, means for detecting the stimulated echo signals generated during the individual sequences, and means for forming the difference between the stimulated echo signals and for reconstructing the lactate distribution from the differences.

BRIEF DESCRIPTION OF THE DRAWING

The invention will be described in detail hereinafter with reference to the drawing. Therein

DESCRIPTION OF THE PREFERRED EMBODIMENT

Figure 1:
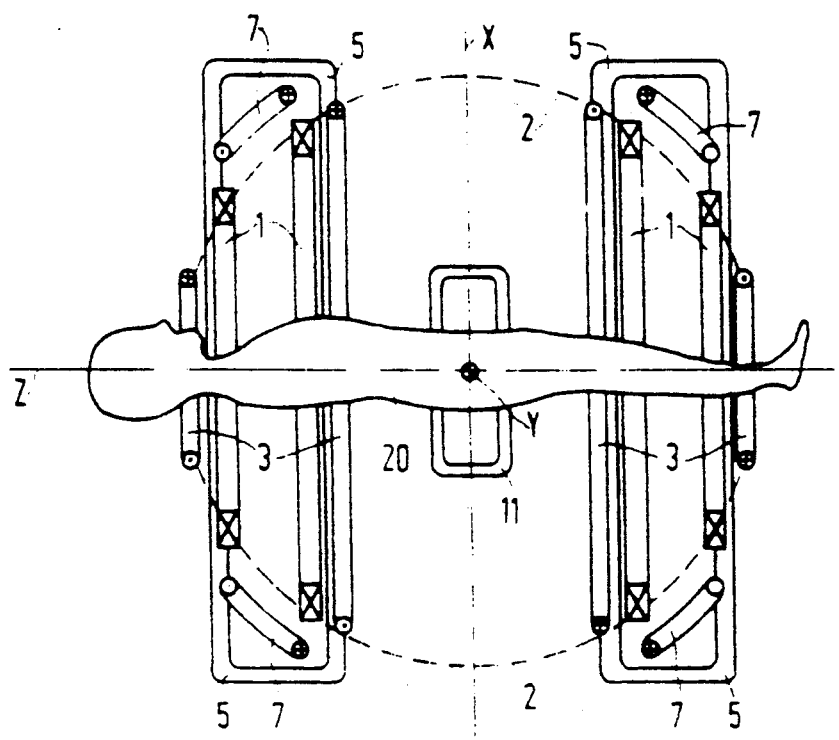
FIG. 1 shows a magnetic resonance tomography apparatus whereby the method in accordance with the invention can be carried out.

The magnetic resonance examination apparatus which is diagrammatically shown in FIG. 1 comprises a device which consists of four coils 1 and which serves to generate a uniform, steady magnetic field of adequate strength, for example 4 Tesla. This field extends in the z-direction of a cartesian coordinate system. The coils are arranged concentrically with the z-axis and can be provided on a spherical surface 2. The patient 20 to be examined is arranged within these coils.

In order to generate a magnetic field Gz which extends in the z-direction and which linearly varies in this direction, four coils 3 are arranged preferably on the same spherical surface. Furthermore there are provided four coils 7 which generate a magnetic gradient field (i.e. a magnetic field whose strength varies linearly in one direction) Gx which also extends in the z-direction but whose gradient extends in the x-direction. A magnetic gradient field Gy which extends in the z-direction and which has a gradient in the y-direction is generated by four coils 5 which may have the same shape as the coils 7 but which are arranged so as to be offset 90° with respect thereto. Only two of these four coils are shown in FIG. 1.

Because each of the three coils systems of coils 3, 5 and 7 for generating the magnetic gradient fields Gz, Gy and Gx is symmetrically arranged with respect to the spherical surface 2, the field strength in the center of the sphere, at the same time being the origin of the cartesian xyz coordinate system, is determined exclusively by the steady, uniform magnetic field of the coil system 1. Furthermore, an rf coil 11 is symmetrically arranged with respect to the plane $z=0$ of the coordinate system, which coil is constructed so that it generates an essentially uniform rf magnetic field which extends in the x-direction, i.e. perpendicular to the direction of the steady, uniform magnetic field. During each rf pulse, the rf coil receives an rf modulated current from an rf generator. Subsequent to a sequence, the rf coil 11, or a separate rf receiver coil, serves for the reception of the spin resonance signals generated in the examination zone.

Figure 2:
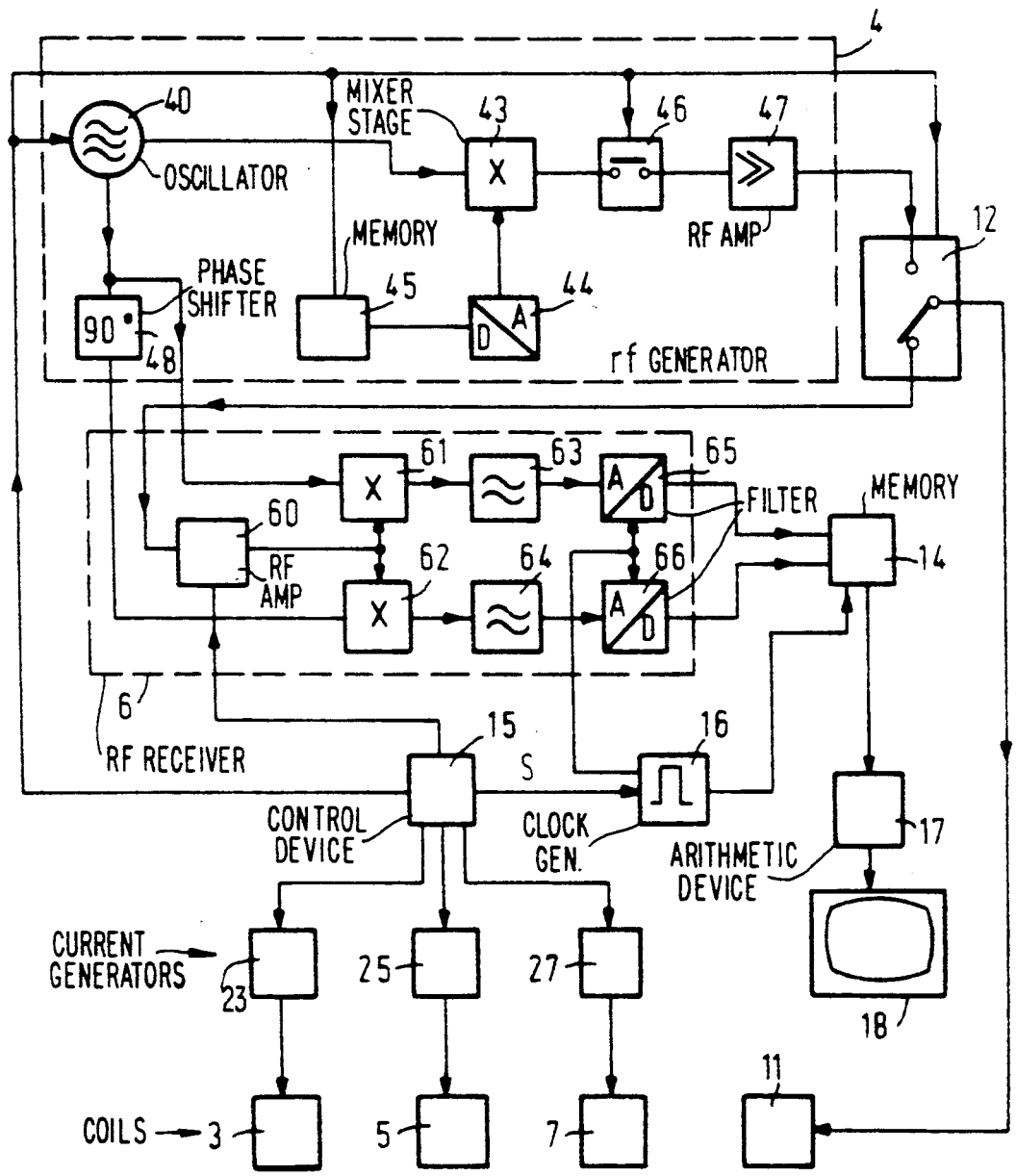
FIG. 2 shows a block diagram of such an apparatus.

FIG. 2 shows a simplified block diagram of this magnetic resonance examination apparatus. The rf coil 11 is connected, via a switching device 12, on the one side to an rf generator 4 and on the other side to an rf receiver 6.

The rf generator 4 comprises an rf oscillator 40 whose frequency can be digitally controlled by a control device 15 and which generates oscillations of a frequency corresponding to the Larmor frequency of the atomic nuclei to be excited at the field strength generated by the coils 1. As is known, the Larmor frequency f is calculated in accordance with the relation $f=cB$, where B is the magnetic induction in the steady, uniform magnetic field and c is the gyromagnetic ratio which, for example amounts to 42.56 MHz/T for protons. The output of the oscillator 40 is connected to an input of a mixing stage 43. The mixing stage receives a second input signal from a digital-to-analog converter 44 whose output is connected to a digital memory 45. A series of digital data words representing an envelope signal is read from the memory under the control of the control device 15.

The mixing stage 43 processes the input signals applied thereto so that the carrier oscillation modulated with the envelope signal appears on its output. The output signal of the mixing stage 43 is applied, via a switch 46 which is controlled by the control device 15, to an rf power amplifier 47 whose output is connected to the switching device 12. The latter device is also controlled by the control device 15.

The receiver 6 comprises an rf amplifier 60 which is connected to the switching device 12 and which receives the spin resonance signals induced in the rf coil 11, provided that the switching device 12 is in the appropriate position. The amplifier 60 comprises a muting input which is controlled by the control device 15 and via which it can be blocked so that the gain is substantially zero. The output of the amplifier is connected to the first inputs of two multiplying mixing stages 61 and 62, each of which supplies an output signal which corresponds to the product of its input signals. The second inputs of the mixing stages 61 and 62 receive a signal having the frequency of the oscillator 40, a phase shift of 90° existing between the signals on the two inputs. This phase shift is realized by a 90° phase shifter 48 whose output is connected to the input of the mixing stage 62 and whose input is connected to the input of the mixing stage 61 and to the output of the oscillator 40.

The output signals of the mixing stages 61 and 62 are applied, via lowpass filters 63 and 64 which suppress the frequency supplied by the oscillator 40 and all higher frequencies and which transmit components of lower frequency, to a respective analog-to-digital converter 65, 66. The latter converts the analog signals of the circuit 61 ... 64, forming a quadrature demodulator, into digital data words which are applied to a memory 14. The analog-to-digital converters 65 and 66 and the memory 14 receive their clock pulses from a clock pulse generator 16 which can be inhibited and enabled by the control device 15, via a control lead, so that the signals supplied by the rf coil 11 and transposed to the low frequency ranged are converted into a series of digital data words for storage in the memory 14 only during a measurement interval which is defined by the control device 15.

The data words stored in the memory 14 are applied to an arithmetic device 17 which determines the spectrum of the nuclear magnetization therefrom for supply to a suitable display unit, for example a monitor 18. The arrangements of coils 3, 5 and 7 are supplied by current generators 23, 25 and 27, respectively, with a current whose temporal variation is controlled by the control device 15.

Figure 3:
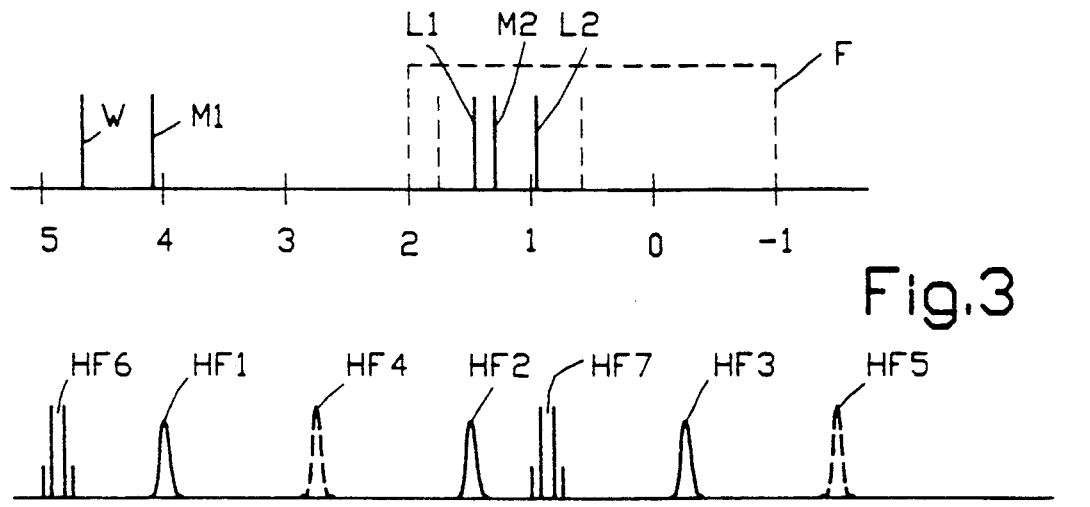
FIG. 3 shows the position of the spectral components of water, lactate and lipids.

FIG. 3 shows the position of the components which are of essential importance for the clinical examination on a frequency scale indicating the frequency deviation, standardized to the Larmor frequency of TMS (tetramethylsilane), with respect to the Larmor frequency of TMS. Thus the Larmor frequency of TMS is situated at the point zero, and the Larmor frequency W of water is situated at 4.7 ppm. The two coupled components M1 and M2 of the CH$_3$ group of lactate are situated at 4.1 ppm and 1.3 ppm, respectively, the corresponding components L1 and L2 of lipids being situated at 1.4 and 0.9.

Figure 4:
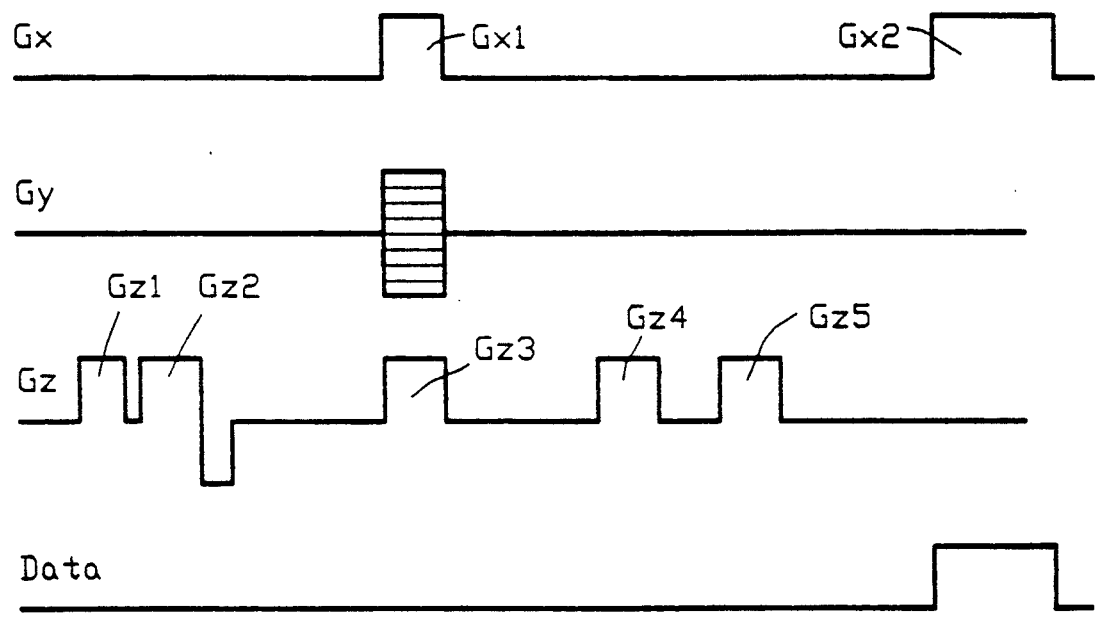
FIG. 4 shows the variation in time of the sequences in accordance with the invention.

The variation in time of a sequence follows from FIG. 4 whose first line represents the position in time of the rf pulses. Each sequence comprises the three rf pulses HF1, HF2, HF3 which are preferably 90° pulses. One of these three rf pulses is slice-selective, preferably the first rf pulse. The other two pulses are preferably frequency-selective. The frequency selective rf pulses have such a narrow bandwidth that only the lactate component M2, the lipid components L1, L2 and some non-coupled lipid components of the spectrum shown in FIG. 3 are excited, but not the lactate component M1 and the water component W. The frequency spectrum of these rf pulses, being substantially rectangular as a result of suitable shaping of the envelope signal derived from the memory 45, is denoted by the reference F in FIG. 3. It appears that the central frequency of the spectrum is situated at 0.5 ppm and that the spectrum extends from $-1$ ppm to $+2$ ppm, i.e. asymmetrically with respect to the frequency components (L1, M2, L2) to be excited. If instead the spectrum were situated symmetrically with respect to the components, the frequency band of the rf pulses should even be narrower and hence their duration should be longer for the same upper limit frequency.

In the sequence shown in FIG. 4, the first rf pulse HF1 is slice-selective, a magnetic gradient field Gz2 being activated during its duration (fourth line of FIG. 4). The rf pulses HF2 and HF3 are frequency-selective and have the excitation spectrum F (FIG. 3). The first rf pulse HF1 excites not only the frequency components in the spectral range F within the slice, but also the frequency components which are situated outside, for example W and M1. The FID signal generated by this rf pulse, also being influenced by inter alia the components W and M1, is dephased by the magnetic gradient fields occurring later in the sequence, so that at the instant at which the stimulated echo signal produced by the three rf pulses occurs, the contributions made to the spin resonance signal by W and M1 have substantially disappeared. Instead of the first rf pulse, the second or the third rf pulse HF2 and HF3, respectively, can also be made slice-selective, the other two pulses then being made frequency-selective; however, the FID signal of the slice-selective rf pulse is then suppressed to a lesser extent. The version which is shown in FIG. 4 and in which the slice selective rf pulse is the first one of the three pulses, therefore, is to be preferred.

The distance in time between the first rf pulse HF1 and the second rf pulse HF2 amounts to $\frac{1}{2}$ J, where J is the scalar coupling constant of lactate (approximately 7 Hz), so that a distance in time of approximately 68 ms is obtained. It is thus achieved that the two frequency components arising because of the J coupling for the lactate component M2, are in phase opposition at the instant of the second rf pulse HF2. The same holds good for the corresponding parts of the lipid components L1 and L2, because their coupling constant J is approximately equal to that of lactate.

As a result of a magnetic gradient field Gz3, applied between the first and the second rf pulse, the nuclear magnetization within the slice varies in a location-dependent manner (in the z-direction). The second rf pulse then partly provides the excitation of higher quantum states which do not produce a signal that can be observed and also provides the transfer of the magnetization from M2 to M1. The magnetization between the lipid groups is similarly transferred. In the latter case the transfer is bilateral, but the transfer between the lactate components is only unilateral; because the component M1 does not "see" the second rf pulse, no transfer takes place from M1 to M2. Consequently, after the second rf pulse the magnetization has disappeared at M2, but not at L1 and L2. When it is ensured in another manner that no polarization transfer takes place from M1 to M2, for example by suppressing the component M1 together with the water component W in advance, it is no longer necessary for the rf pulses HF2 and HF3 to be frequency selective. They may then be slice selective in the same way as the first rf pulse (HF1).

Subsequent to the third rf pulse and prior to the appearance of the stimulated echo signal a magnetic gradient field Gz5 is applied whose gradient extends in the same direction as that of the field Gz3 and whose amplitude and duration are chosen so that the time integral over Gz3 is exactly equal to that over Gz5. This eliminates the effect of Gz3 on the stimulated echo signal. The stimulated echo signal occurs at a distance in time from HF3 which corresponds to the distance in time between HF1 and HF2. During the stimulated echo signal, a so-called measurement or read gradient Gx2 is applied, which gradient precedes a read gradient Gx1 between the first and the second rf pulse whose time integral amounts to half the time integral over Gx2 (see second line of FIG. 4).

As appears from the fifth line of FIG. 4, the clock generator 16 is enabled during the appearance of the stimulated echo signal, so that the stimulated echo signal is stored in the memory 14 as a series of digital data words. The stimulated echo signal is influenced by all components within the frequency range F, except for the component M2.

After a suitable repetition time this sequence is repeated, the only difference being that exactly halfway between the first and the second rf pulse there is generated a 180° rf pulse HF4 which is denoted by a broken line on the first line of FIG. 4, and that a further 180° rf pulse HF5 is generated after the third rf pulse HF3, the distance in time between the pulses HF5 and HF3 being equal to the distance in time between HF4 and HF1. These pulses are also frequency-selective in such a way that only one of the components M1 or M2 is excited. Depending on whether one or both components of a J-coupling see these pulses or not, the modulation caused by the J coupling is refocused or not refocused, respectively. Consequently, the modulation of the components L1 and L2 by the J coupling takes place in the same way as in the first sequence (without HF4). However, when the frequency components of the lactate component M2 are in phase at the instant of the second rf pulse HF2, they thus contribute to the formation of a normal stimulated echo.

When only M2 is excited, for example when HF4 has the spectrum F, a negative effect may occur on the stimulated echo signal, notably when the rephasing realized by Gz3 is not complete. In this respect a frequency spectrum exciting only the component M1 but not M2 (and L1, L2) is more attractive. Even though an additional undesirable excitation of the water component W could then occur in given circumstances, such excitation can be comparatively completely suppressed, so that the latter version is to be preferred.

As has already been explained, the coupled lipid components L1, L2 and the non-coupled components within the zone F thus influence the stimulated echo signal in the second sequence in exactly the same way as in the first sequence; however, in the second sequence the lactate component M2 contributes to the stimulated echo signal as opposed to the first sequence. Therefore, when the two stimulated echo signals are subtracted from one another, the difference will be determined only by the lactate component M2. The lactate distribution in the slice can thus be reproduced.

To this end, the two sequences are repeated a number of times, each time a magnetic gradient field (Gy, third line) which extends perpendicular to the read gradient (Gx, second line) and perpendicular to the slice selection gradient (Gz, fourth line), i.e. in the y direction, being varied as regards amplitude. The entire procedure can be repeated a further number of times in order to improve the signal-to-noise ratio.

For the reconstruction of the lactate distribution in the excited slice various possibilities exist. A first image could be formed from the stimulated echo signals of the first sequences and a second image could be formed from the stimulated echo signals of the second sequences, the images being subtracted from one another. From a point of view of calculation and storage, however, it is simpler to subtract the stimulated echo signals of the first and the second sequence. associated with the same phase encoding gradient, directly from one another, and to subject the difference signals thus formed to a two-dimensional Fourier transformation.

The diagrammatic representation of FIG. 3 does not show that the component W is dominant in the human body, because the concentration of the protons bound to water is several powers of ten higher than the concentration of, for example protons bound to the lactate component M2. When the frequency spectrum of the frequency selective pulses HF2 and HF3 does not correspond to the ideal spectrum shown in FIG. 3 but is formed so that the water component can also be excited be it in a very diminished way only, the stimulated echo signal can still be substantially determined by the latter component. For substantial suppression of this component, prior to the first rf pulse HF1 and/or between the second rf pulse HF2 and the third rf pulse HF3 there can be generated a frequency selective pulse HF6 or HF7, respectively, tuned to the resonance line of the water component, followed each time by a magnetic gradient field (Gz1 or Gz4) which dephases the water component thus excited, so that its influence on the stimulated echo signal is strongly reduced.

In the present embodiment the frequency-selective rf pulseS HF6 and HF7 are so called binomial rf pulses which consist of several sub-pulses whose amplitude ratio equals the ratio of the binomial coefficients and whose distances in time or central frequency are optimized as regards excitation of the water component. However, other pulses can alternatively be used, for example so-called DANTE pulses.

When the water component W has been suppressed, the lactate component M1 has usually also been suppressed. Because polarization transfer can then no longer take place between M1 and M2, the rf pulses HF2 and HF3 need not be frequency selective in that case. Therefore, their bandwith may also be wider. In order to facilitate signal processing, however, they should then be slice-selective in the same way as HF1; this means that a magnetic gradient field (such as Gz2) which extends in the z-direction should be generated in their presence.

I claim:

1. A magnetic resonance imaging method in which the following steps are executed in the presence of a uniform, steady magnetic field:
   a) generating a first sequence for stimulating echo signals and comprising three rf pulses, at least one of which (HF1) is slice selective, between a first and a second rf pulse (HF2) as well as after a third rf pulse (HF3) and prior to detection of a spin resonance signal applying a first magnetic gradient field each with a same time integral, the distance in time between the first and the second rf pulse being $\frac{1}{2}$ J, where J is the coupling constant of lactate, and
   b) generating a second sequence for stimulating echo signals and which sequence deviates from the first sequence by generating two 180° rf pulses each at the same distance from the first and the third rf pulse (HF1 and HF3), respectively, one 180° rf pulse being halfway between the first (HF1) and the second rf pulse (HF2), both 180° rf pulses (HF4, HF5) being frequency selective so that only one of two coupled lactate components (M1 or M2) is excited,
   c) detecting the stimulated echo signals occurring in each sequence,
   d) repeating the steps a) to c) while varying at least one second magnetic gradient field perpendicular to the first gradient field in respect of strength and/or direction,
   e) forming a difference between the stimulated echo signals of the first and the second sequences, and
   f) reconstructing lactate distribution in the excited slice from the differences.

2. A method as claimed in claim 1 wherein the first one (HF1) of the three rf pulses is slice-selective and the two subsequent rf pulses (HF2 and HF3) are frequency-selective.

3. A method as claimed in claim 2 wherein a central frequency of the frequency-selective pulses (HF2, HF3) is below the Larmor frequencies of coupled lipid and lactate components.

4. A method as claimed in claim 2 wherein in each sequence, prior to the first and/or between the second and the third rf pulse, generating a selective rf pulse (HF5 and HF6) which excites only a water component formed by water-bound protons, followed by a magnetic gradient field which dephases the water component.

5. A method as claimed in claim 1 wherein of the coupled lactate components, (M1, M2) the two 180° rf pulses (HF4, HF5) excite only the component (M1) which is near a water component (W).

6. A method as claimed in claim 1 wherein in each sequence, prior to the first and/or between the second and the third rf pulse, generating a selective rf pulse (HF5 or HF6) which excites only a water component formed by water-bound protons, followed by a magnetic gradient field which dephases the water component.

7. A magnetic resonance imaging device comprising:
   means for generating a uniform, steady magnetic field;
   means for stimulating echo signals by generating a first sequence comprising three rf pulses in said field, at least one of which pulses (HF1) is slice selective, between a first and a second rf pulse (HF2) as well as after a third rf pulse (HF3) and prior to detection of a spin resonance signal applying a first magnetic gradient field each with a same time integral, the distance in time between the first and the second rf pulse being $\frac{1}{2}$ J, where J is the coupling constant of lactate;
   means for stimulating echo signals by generating a second sequence which deviates from the first sequence by generating additional two 180° rf pulses (HF4, HF5) each at the same distance from the first and the third rf pulse (HF1 and HF3), respectively, one 180° rf pulse being halfway between the first (HF1) and the second rf pulse (HF2), both 180° rf pulses (HF4, HF5) being frequency-selective so that only one of two coupled lactate components (M1 or M2) is excited;
   means for detecting the stimulated echo signals occurring in each sequence;
   means for repeating the first and second sequences while varying at least one second magnetic gradient field perpendicular to the first gradient field in respect of strength and/or direction;
   means for forming a difference between the stimulated echo signals of the first and second sequences; and
   means for reconstructing lactate distribution in the excited slice from the differences.

* * * * *